United States Patent
Lee et al.

(10) Patent No.: US 6,992,019 B2
(45) Date of Patent: Jan. 31, 2006

(54) METHODS FOR FORMING SILICON DIOXIDE LAYERS ON SUBSTRATES USING ATOMIC LAYER DEPOSITION

(75) Inventors: Joo-won Lee, Suwon-si (KR); Jae-eun Park, Yongin-si (KR); Jong-ho Yang, Seoul-si (KR); Kang-soo Chu, Suwon-si (KR)

(73) Assignee: Samsung Electronics Co., Ltd., (KR)

( * ) Notice: Subject to any disclaimer, the term of this patent is extended or adjusted under 35 U.S.C. 154(b) by 65 days.

(21) Appl. No.: 10/459,943

(22) Filed: Jun. 12, 2003

(65) Prior Publication Data

US 2004/0018694 A1     Jan. 29, 2004

(30) Foreign Application Priority Data

Jul. 8, 2002    (KR)  ............................... 2002-39428
Jan. 30, 2003    (KR)  ..................... 10-2003-0006370

(51) Int. Cl.
     *H01L 21/302*      (2006.01)
(52) U.S. Cl. ..................................................... 438/763
(58) Field of Classification Search ............... 438/762
     See application file for complete search history.

(56) References Cited

U.S. PATENT DOCUMENTS

| | | | |
|---|---|---|---|
| 3,313,792 A * | 4/1967 | Duck et al. .................. | 526/126 |
| 5,037,514 A | 8/1991 | Yamazaki | |
| 5,470,800 A | 11/1995 | Muroyama ................... | 437/238 |
| 6,037,275 A | 3/2000 | Wu et al. ..................... | 438/780 |
| 6,090,442 A | 7/2000 | Klaus et al. ........... | 427/255.15 |
| 6,270,572 B1 | 8/2001 | Kim et al. ..................... | 117/93 |
| 6,391,803 B1 | 5/2002 | Kim et al. ................... | 438/787 |
| 6,465,371 B2 | 10/2002 | Lim ............................ | 438/785 |
| 6,534,395 B2 | 3/2003 | Werkhoven et al. | |
| 6,664,156 B1 | 12/2003 | Ang et al. | |
| 2002/0001974 A1 | 1/2002 | Chan .......................... | 438/785 |
| 2002/0047151 A1 | 4/2002 | Kim et al. | |
| 2002/0068466 A1 | 6/2002 | Lee et al. ................... | 438/765 |
| 2002/0164890 A1 | 11/2002 | Kwan et al. | |
| 2003/0015764 A1 | 1/2003 | Raaijmakers et al. | |
| 2004/0096582 A1 * | 5/2004 | Wang et al. ........... | 427/255.27 |

FOREIGN PATENT DOCUMENTS

EP           1 003 210          5/2000

(Continued)

OTHER PUBLICATIONS

Klaus, J.W., et al., "Atomic layer controlled growth of $SiO_2$ films using binary reaction sequence chemistry," American Institute of Physics, 1997, pp. 1092-1094.

*Primary Examiner*—W. David Coleman
(74) *Attorney, Agent, or Firm*—Mills & Onello LLP

(57) ABSTRACT

Improved methods are disclosed for catalyst-assisted atomic layer deposition (ALD) to form a silicon dioxide layer having superior properties on a semiconductor substrate by using a first reactant component consisting of a silicon compound having at least two silicon atoms, or using a tertiary aliphatic amine as the catalyst component, or both in combination, together with related purging methods and sequencing.

36 Claims, 11 Drawing Sheets

FOREIGN PATENT DOCUMENTS

| | | |
|---|---|---|
| EP | 1 096 042 | 5/2001 |
| EP | 1 139 399 | 10/2001 |
| JP | 06132276 | 5/1994 |
| JP | 10189582 | 7/1998 |
| JP | 2001002990 | 1/2001 |
| KR | 02-2579 | 1/2002 |
| KR | 02-44422 | 6/2002 |
| KR | 2002-0085487 | 11/2002 |

* cited by examiner

METHODS FOR FORMING SILICON DIOXIDE LAYERS ON SUBSTRATES USING ATOMIC LAYER DEPOSITION

BACKGROUND OF THE INVENTION

1. Field of the Invention

The present invention relates generally to improved methods for growing silicon dioxide layers on substrates, such as in semiconductor manufacture, using atomic layer deposition processes. The methods of this invention facilitate exercising extremely precise control over the properties of a silicon dioxide layer applied, for example, to a gate oxide or a dielectric layer. The methods of this invention have particular utility in fabricating gate spacers, gate oxides, silicide blocking layers, bit line spacers, inter-level dielectric layers, etch stoppers, and related final or intermediate products in semiconductor fabrication.

2. Description of the Related Art

In manufacturing a semiconductor device, a silicon dioxide layer is typically formed on a substrate surface by such conventional techniques as chemical vapor deposition (CVD), low-pressure CVD (LPCVD), or plasma-enhanced CVD (PECVD). These techniques are recognized as providing a good step coverage at a comparatively low temperature. As the density of a semiconductor device increases, however, so too do the heights of the respective elements which comprise the device. As a result, a problem arises due to increased pattern density variation and a corresponding decrease in uniformity.

As taught in U.S. Pat. No. 6,090,442 (Klaus '442), which patent is incorporated herein by reference, one approach to these recognized problems was to use an atomic layer deposition (ALD) technique. Klaus '442 teaches, however, that the big drawback to ALD techniques was that they typically required temperatures greater than 600° K. and reactant exposures of greater than $10^9$ L (where 1 L=$10^{-6}$ Torr see) for the surface reactions to reach completion. Such high temperature and high exposure procedures are not desirable for ultra-thin film deposition applications for various reasons including the difficulty of carrying out such procedures.

An improved approach to such problems was taught by the Klaus '442 patent. Klaus '442 provides a method for growing atomic layer thin films on functionalized substrates at room temperatures utilizing catalyzed binary reaction sequence chemistry. More particularly, according to the Klaus '442 patent, a two-step atomic layer deposition (ALD) process, using two catalyst-assisted "half-reactions" carried out at room temperature, can be used to grow a silicon dioxide film on an OH terminated substrate.

In a specific embodiment, Klaus '442 utilizes $SiCl_4$ as a "first molecular precursor" and pyridine as a catalyst. First, the substrate is functionalized with $OH^-$ as a "first functional group," for example using $H_2O$. Next, the functionalized substrate is exposed to a catalyst that is a Lewis base or Lewis acid (e.g., pyridine) and a first molecular precursor which includes the primary element of the film to be grown as well as a second functional group (e.g., $SiCl_4$). As described by Klaus '442, in the first "half-reaction," the catalyst interacts with the first functional group of the functionalized substrate; then, the first molecular precursor reacts with the first functional group (which has been activated by the catalyst) resulting in a displacement of the catalyst and a bond between the first functional group of the substrate and the primary element of the first molecular precursor. Taken together, these two reactions comprise the first "half-reaction" and represent the beginning of film formation with the second functional group now located across the surface of the film.

At this point in the Klaus '442 process, excess first molecular precursor and any byproducts are purged from the reaction chamber, and the partially-reacted substrate is exposed to additional catalyst and a second molecular precursor. The catalyst activates the exposed second functional group along the surface of the film by reacting with it and with a second molecular precursor, resulting in a displacement of the second functional group and also resulting in a bond to the primary element of the first molecular precursor. Now, the second molecular precursor reacts with the bond between the primary element of the first molecular precursor and the catalyst resulting in a displacement of the catalyst and the deposition of the first functional group on the newly-grown surface layer, thereby completing a full growth/deposition cycle and restoring the substrate surface to a functionalized state in preparation for the next cycle.

Although the catalyst-assisted deposition processes of the Klaus '442 patent represent substantial advances in ALD technology, and do make possible room-temperature ALD, it has been found that the surface density, uniformity and quality of thin films grown using the Klaus '442 technique will not meet increasingly demanding standards in the semiconductor industry. With the seemingly never-ending evolution toward ever-smaller microelectronic components, ever-more precise control is required over the properties of semiconductor devices. Such precision control requires increasingly highly uniform surface properties and pattern density. It has now been found that novel improvements in ALD techniques in accordance with this invention produce thin films for semiconductor devices having superior surface density and significantly more uniform surface properties than could be achieved with prior art methods resulting in surprisingly more precise control over the properties of a thin film layer and in higher quality semiconductor devices suitable for modern miniaturization applications.

The Klaus '442 patent represents that: "Strong amine bases like triethylamine ($(C_2H_5)_3N$) have been shown to form salt compounds like triethylammonium chloride (NH+(C2H5)3Cl−) in the presence of chlorosilanes. These salts could poison the surface and degrade the reaction efficiency as they build up." (column 9, line 24~28). Thus, Klaus '442 appears to teach away from the presence of triethylamine, i.e. tertiary aliphatic amine, in ALD applications. But, in this invention, control of process conditions coupled with a variety of purge methods have been found to solve the above problems.

OBJECTS OF THE INVENTION

Accordingly, a general object of this invention is to provide improved methods for using atomic layer deposition (ALD) to grow highly uniform thin films having superior surface density, extremely high purity, and with highly precise control of surface properties.

A further object of this invention is to provide ALD methods for forming silicon dioxide layers on a semiconductor substrate using silicon compounds having at least two silicon atoms as one of the reactant materials.

Still another object of this invention is to provide ALD methods for forming silicon dioxide layers on a semiconductor substrate using tertiary aliphatic amine compounds as a catalyst material.

Yet another object of this invention is to provide optimum temperature and pressure ranges for carrying out the methods of this invention.

Another object of this invention is to provide reaction/purging process sequences, and timing and techniques for carrying out such deposition cycles, to enhance the benefits of the methods of this invention.

Still another object of this invention is to provide methods for hardening a silicon dioxide thin film formed on a substrate by the methods of this invention.

Yet another object of this invention is to provide improved semiconductor devices having a substrate with a silicon dioxide layer which has superior surface density and is of extremely high purity and uniformity deposited along a surface of the substrate for use in such applications as gate spacers, gate oxides, silicide blocking layers, bit line spacers, interlevel dielectric layers, etch stoppers, and the like.

A specific object of this invention is to provide catalyst-assisted ALD methods for forming silicon dioxide layers on a semiconductor substrate using $Si_2Cl_6$ as the first reactant, or using a tertiary aliphatic amine as the catalyst, or both.

These and other objects, advantages and improvements of the present invention will be better understood by the following description which is to be read in conjunction with the several Figures and Drawings as discussed hereinafter.

SUMMARY OF THE INVENTION

The invention consists of improved methods for using catalyst-assisted atomic layer deposition (ALD) to form silicon dioxide thin films having enhanced properties and purity on semiconductor substrates. In one invention embodiment, a silicon compound having at least two silicon atoms, e.g., $Si_2Cl_6$, is used as the first reactant in an ALD process. In a second invention embodiment, a tertiary aliphatic amine compound, e.g., trimethyl amine, is used as the catalyst in an ALD process. In a third invention embodiment, a silicon compound having at least two silicon atoms is used as the first reactant and a tertiary aliphatic amine is used as the catalyst in an ALD process. In other invention embodiments, methods for hardening the deposited silicon dioxide thin films are provided, optimum temperature and pressure conditions for carrying out the methods of this invention are established, and alternative reaction/purging process sequences for the methods of this invention are described.

DETAILED DESCRIPTION OF PREFERRED EMBODIMENTS

Table 1 below is a summary comparing the theoretical chemical reactions underlying the prior art high-temperature ALD technique and the catalyst-assisted ALD technique of the Klaus '442 patent with three illustrative embodiments of the present invention, as described hereinafter.

TABLE 1

| | |
|---|---|
| High-Temperature ALD | Si—OH* + $SiCl_4$ →Si—O—Si—$Cl_3$* + HCl |
| | Si—Cl* + $H_2O$→Si—OH* + HCl |
| Klaus '442 patent | Si—OH* + $C_5H_5N$ + $SiCl_4$ →*Si—O—Si—$Cl_3$* + HCL + $C_5H_5N$ |
| | Si—O—Si—$Cl_3$* + $C_5H_5N$ + $H_2O$ |
| | →Si—O—Si—OH* + HCl + $C_5H_5N$ |
| Present Invention: | Si—OH* + $Si_2Cl_6$ + $C_5H_5N$ |
| 1st ex. embodiment | →Si—O—Si($Cl_2$) Si—$Cl_3$* + HCl + $C_5H_5N$ |

TABLE 1-continued

|  | |
|---|---|
|  | Si—O—Si(Cl$_2$)—Si—Cl$_3$* + C$_5$H$_5$N + H$_2$O<br>→Si—O—Si—O—Si—OH* + HCl + C$_5$H$_5$N |
| Present Invention<br>2nd ex embodiment | Si—OH* + SiCl$_4$ + R$_3$N<br>→Si—O—Si—Cl$_3$* + HCl + C$_5$H$_5$N<br>Si—O—Si—Cl$_3$* + R$_3$N + H$_2$O<br>→Si—O—Si—OH* + HCl + C$_5$H$_5$N |
| Present Invention<br>3rd ex. embodiment | Si—OH* + Si$_2$Cl$_6$ + R$_3$N<br>→Si—O—Si(Cl$_2$)—Si—Cl$_3$* + HCL + R$_3$N<br>Si—O—Si(Cl$_2$)—Si—Cl$_3$* + R$_3$N + H$_2$O<br>→Si—O—Si—O—Si—OH* + HCl + R$_3$N |

(Wherein the asterisk* designates the surface species)

Table 2 below is a summary of illustrative combinations of catalyst, first reactant and second reactant corresponding to different illustrative embodiments of the present invention as described hereinafter.

TABLE 2

|  | Catalyst | 1$^{st}$ reactant | 2$^{nd}$ reactant |
|---|---|---|---|
| 1st ex. embodiment | Ammonia, amine | Si$_2$Cl$_6$ | H$_2$O, H$_2$O$_2$, ozone |
| 2nd ex. embodiment | Tertiary aliphatic amine (R$_3$N) | SiCl$_4$ | H$_2$O, H$_2$O$_2$, ozone |
| 3rd ex. embodiment | Tertiary aliphatic amine (R$_3$N) | Si$_2$Cl$_6$ | H$_2$O, H$_2$O$_2$, ozone |

Figure 1:
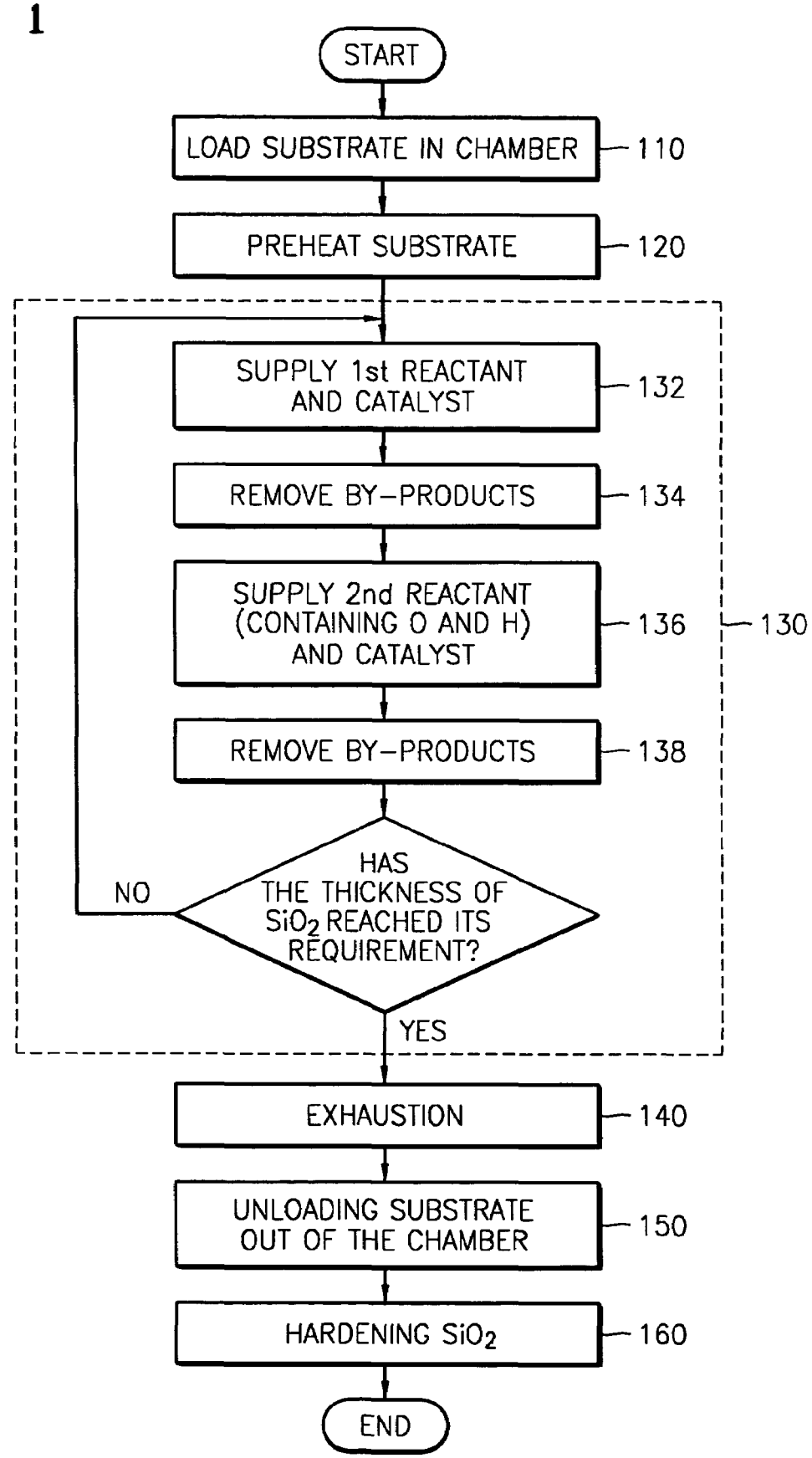
FIG. 1 is a flow chart that schematically illustrates the steps of the ALD methods of this invention for forming a silicon dioxide thin film on a substrate.

FIG. 1 is a flow chart that schematically illustrates the several steps, procedures and sequential chemical reactions which apply generically to the methods of this invention for forming silicon dioxide thin films on a substrate by means of a catalyzed atomic layer deposition (ALD) procedure. The steps illustrated in the flow chart of FIG. 1 are discussed below.

Step 110

A suitable functionalized substrate is loaded into a reaction chamber.

Step 120

The substrate is preheated until the temperature of the substrate reaches a suitable temperature for starting the silicon dioxide ALD process, typically about 25°–150° C. The reaction chamber is exhausted either at the same time as or immediately following the preheating. Evacuating the chamber might typically take under 60 seconds.

Step 130

A new silicon dioxide layer is formed on the substrate surface by ALD. The cycle is repeated until a desired thickness of a silicon dioxide thin film is grown on the substrate. Step 130 is comprised of substeps 132–138, which are discussed individually below.

Steps 132–138

Step 132

A mixture of the first reactant and catalyst is supplied to the reaction chamber. The catalyst acts by lowering reaction activation energy of the first reactant on the substrate. As a result, the process temperature is lowered to about room temperature or slightly above room temperature.

When the first reactant is supplied, the process temperature in the chamber is typically about 25°–150° C., preferably about 90°–110° C. The process pressure in the chamber is typically about 0.1~100 torr, preferably about 0.5~5 torr. An inert gas, for example, argon (Ar), may be supplied to the chamber along with first reactant and catalyst.

The H of the —OH reaction sites reacts with a halogen atom of the first reactant in the presence of the first base catalyst to form halogen acid. The halogen acid is neutralized with the first base catalyst, and a salt is produced. At the same time, Si atoms of the first reactant react with the O on a reaction site on the substrate to form a chemisorbed layer of the first reactant.

Step 134

By-products of the first reaction process (step 132), for example, salt, unreacted first reactant, etc. are removed.

Step 136

A mixture of the second reactant (which contains O and H) and a second base catalyst is now supplied to the chamber causing the chemisorbed layer of the first reactant to chemically react with the second reactant.

An example of the second reactant is H$_2$O, H$_2$O$_2$, or ozone. In one preferred embodiment, the second base catalyst is the same as the first base catalyst.

When the second reactant is supplied to the reaction chamber, the ranges of temperature and pressure in the chamber are typically substantially the same as the ranges of temperature and pressure used in step 132.

In this step, the O element of the second reactant reacts with Si which is chemisorbed on the substrate surface. In the presence of the second base catalyst, the H element of the second reactant reacts with the halogen atom, so halogen acid is produced. Salt is then produced by neutralization between such halogen acid and the base catalyst.

Step 138

The by-products of the second reaction process (step 136) are removed.

Step 140

The reaction chamber is exhausted to remove any remaining deposition by-products in the chamber, a step desirably completed in about 90 seconds. During step 140, no gas is supplied to the chamber.

Step 150

The substrate with an SiO$_2$ thin film along its surface is unloaded from the chamber.

Step 160

This step involves hardening the newly deposited SiO$_2$ thin film. There are three alternative methods which may be used for hardening the silicon dioxide layer deposited in accordance with this invention.
1. Thermal treatment: Annealing the substrate at about 300°C.–900° C. in the presence of a substantially inert gas (i.e., inert relative to the substrate surface), e.g., $N_2$, $O_2$, $H_2$, Ar, etc.
2. Plasma treatment: Annealing the substrate at about 200° C.–700° C. in the presence of $O_2$ or $H_2$.
3. $O_3$ treatment, typically at about 25° C.–700° C.

Any of the three foregoing hardening methods may be used in situ with $SiO_2$ thin films grown using a catalyzed ALD process in accordance with this invention. Hardening methods 2 and 3 above have been found to work especially well.

First Exemplary Embodiment

According to a first exemplary embodiment of the present invention, silicon dioxide thin films are grown on the functionalized surface of a substrate having hydroxyl groups using $Si_2Cl_6$ or a comparable compound, e.g., a silicon halide having two or more silicon atoms, as the first reactant; a compound containing O and H elements, e.g., $H_2O$ and/or $H_2O_2$, as the second reactant; and a base compound, e.g., ammonia or an amine, as the catalyst. For this embodiment of the invention, the first reactant is a silicon compound having at least two silicon atoms, for example a silicon-halide compound selected from the group consisting of: $Si_2X_6$, $Si_3X_8$, $Si_4X_{10}$, and $Si_3X_6$ (Triangle), which has the following chemical structure:

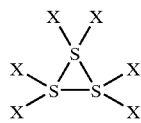

wherein X is a halogen such as F, Cl, Br, I. In a preferred embodiment, the first reactant is selected from the group consisting of $Si_2Cl_6$, $Si_3Cl_8$, $Si_4Cl_{10}$ and $Si_3Cl_6$(Triangle). For this embodiment of the invention, the second reactant is a compound containing oxygen (O) and hydrogen (H) components selected from the group consisting of $H_2O$; $H_2O_2$; and ozone.

Figure 2:
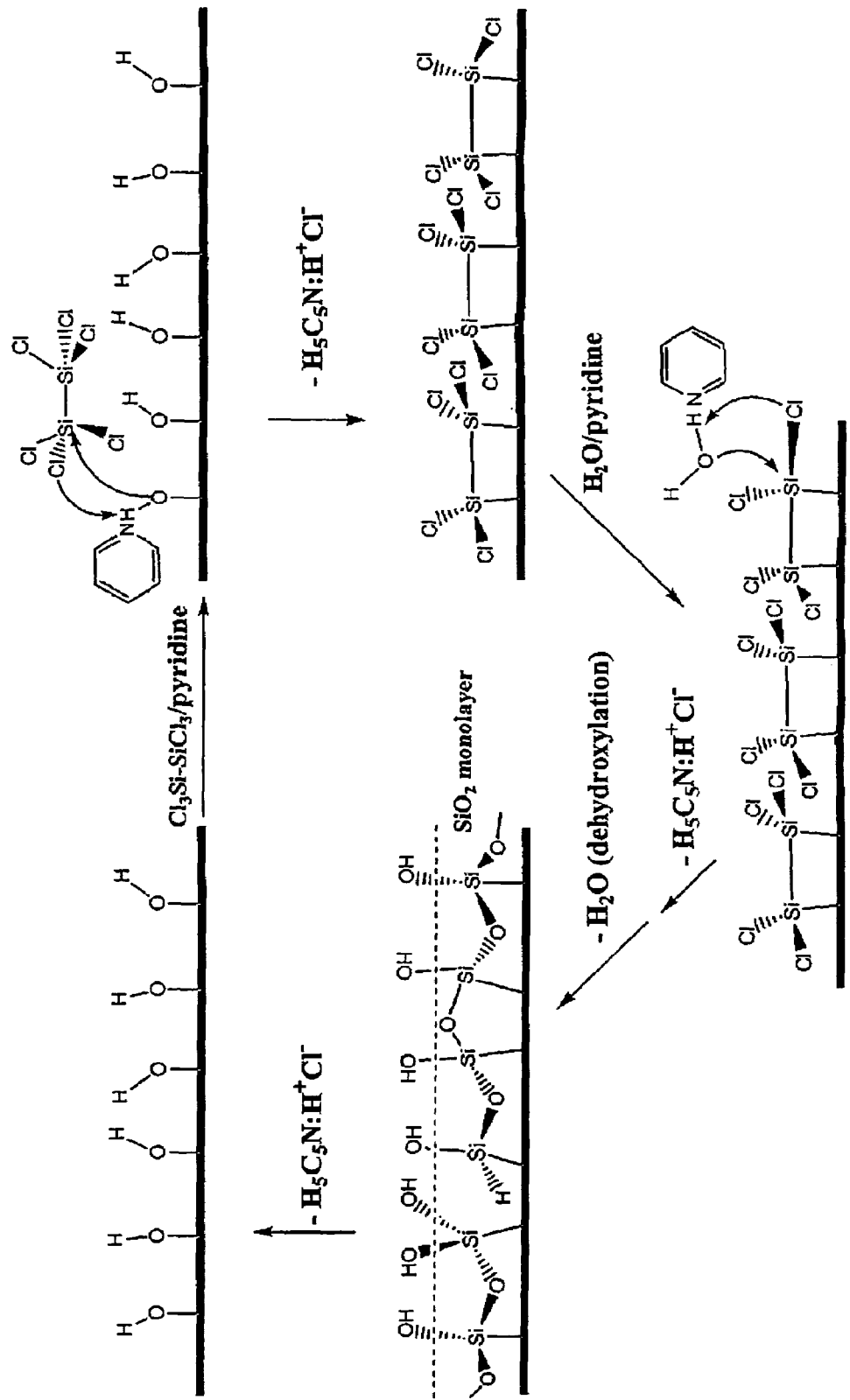
FIG. 2 is a schematic illustration of the several chemical reaction steps, showing what is theorized to be the underlying chemistry, on which the improved ALD methods of this invention are based.

As schematically illustrated in FIG. 2, by exposing the hydroxyl group functionalized surface of the substrate to a mixture of the first reactant and the catalyst in a first step, a chemisorbed layer of the first reactant is formed along the substrate surface. Unreacted first reactant and byproducts are then removed from the region of the substrate. In the next process step, also illustrated in FIG. 2, the chemisorbed layer of the first reactant is reacted with the second reactant in the presence of a base compound as the catalyst, which may be the same catalyst used in reacting the first reactant or a different base compound catalyst. Unreacted second reactant and byproducts of this second reaction step are removed from the substrate region. The surface of the substrate, now containing a new $SiO_2$ monolayer, is restored to the hydroxyl group functionalized state ready to begin a new ALD cycle.

Although the foregoing process is generally similar to the catalyst-assisted ALD technique described in the Klaus '442 patent, the selection of different reactants and catalyst(s) has been found to have dramatic and surprising impacts on the nature and quality of the thin film surface layer of the substrate. One important difference is that whereas the Klaus '442 patent teaches the use of $SiCl_4$, a silicon halide having only a single silicon atom, the above-described embodiment of the present invention utilizes a silicon halide, e.g., $Si_2Cl_6$, that has at least two silicon atoms. It has been found in accordance with this invention that this difference results in a significant improvement in the growth rate. In particular, it has been found that a $SiCl_4$ monolayer has large spaces between the molecules. In the case of $SiCl_4$, when a Si atom reacts with the O—H site on the substrate and forms a single bond with O, $SiCl_4$ is rotated. Due to the steric hindrance of Cl (which does not participate in the reaction), the next O—H site cannot react with another $SiCl_4$. By contrast, a $Si_2Cl_6$ monolayer can react with two Si atoms at the same time and thus speeds up the ALD process. Furthermore, the quality of the resulting silicon dioxide layer is better because the molecular packing along the surface is denser.

FIGS. 3–6, as discussed further below, compare the properties and performance of $SiO_2$ monolayers grown on a substrate using the hexachlorodisilicon (HCD) method of this invention with $SiO_2$ monolayers grown using the tetrachlorosilicon (TCS) method of Klaus '442.

Figure 3:
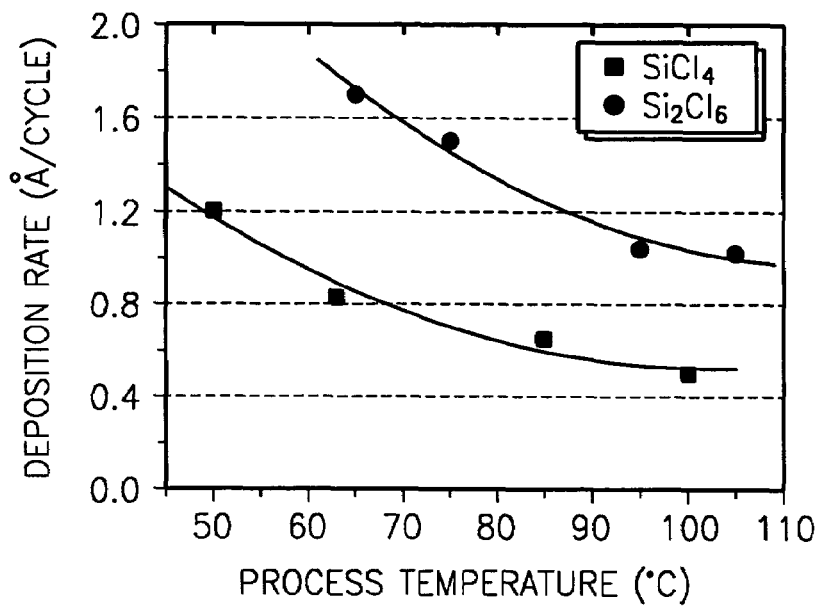
FIG. 3 compares the silicon dioxide deposition rate on a substrate for an ALD method according to this invention with that for a prior art ALD process.

For example, the graph in FIG. 3 compares the deposition rates of $SiO_2$ monolayers on a substrate utilizing the prior art $SiCl_4$ approach with those obtained utilizing the $Si_2Cl_6$ technique of this invention at varying process temperatures. FIG. 3 shows that, at every process temperature, the deposition rate utilizing $Si_2Cl_6$ (circular points) is approximately double the deposition rate using $SiCl_4$ (square points).

Figure 4:
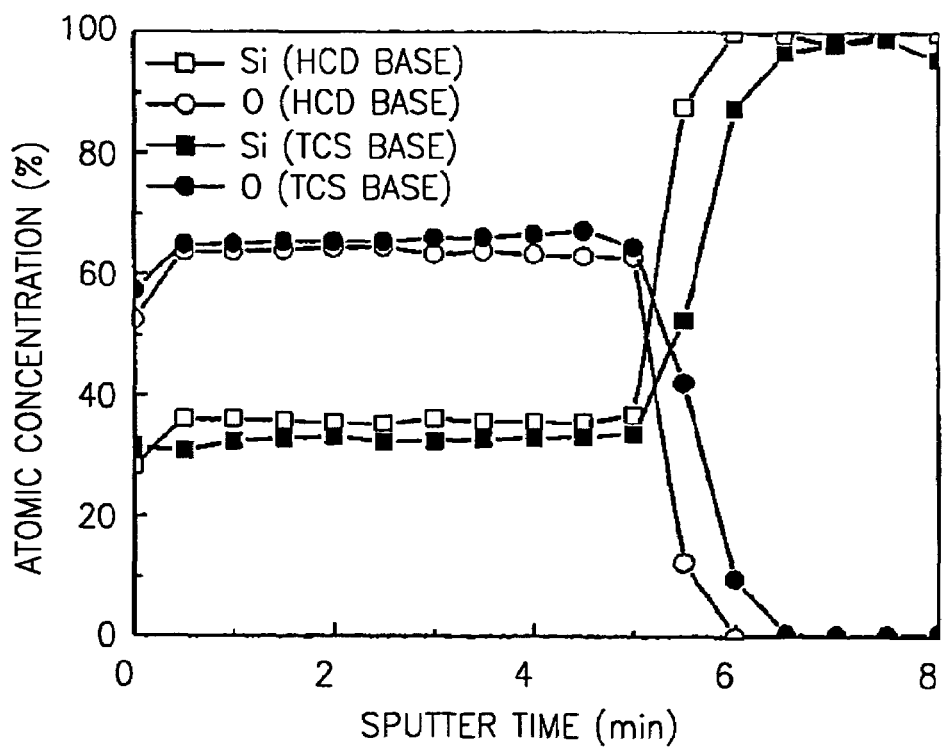
FIG. 4 compares the silicon "richness" of a thin film $SiO_2$ layer formed on a substrate using an ALD method according to this invention with that for a prior art ALD process.

FIG. 4 compares the "silicon richness" of a thin film layer grown on a substrate using the prior art TCS ($SiCl_4$) approach with that of a thin film grown using the HCD ($Si_2Cl_6$) approach of this invention. Using Auger electron spectroscopy to measure atomic concentrations of Si and O on the substrate surface at varying sputter times, FIG. 4 shows that the ratio of Si to O using the TCS technique is 1:1.95 while the Si to O ratio using the HCD technique is 1:1.84. In other words, the thin film $SiO_2$ layer which is formed using the HCD approach is desirably "richer" in silicon.

Figure 5A:
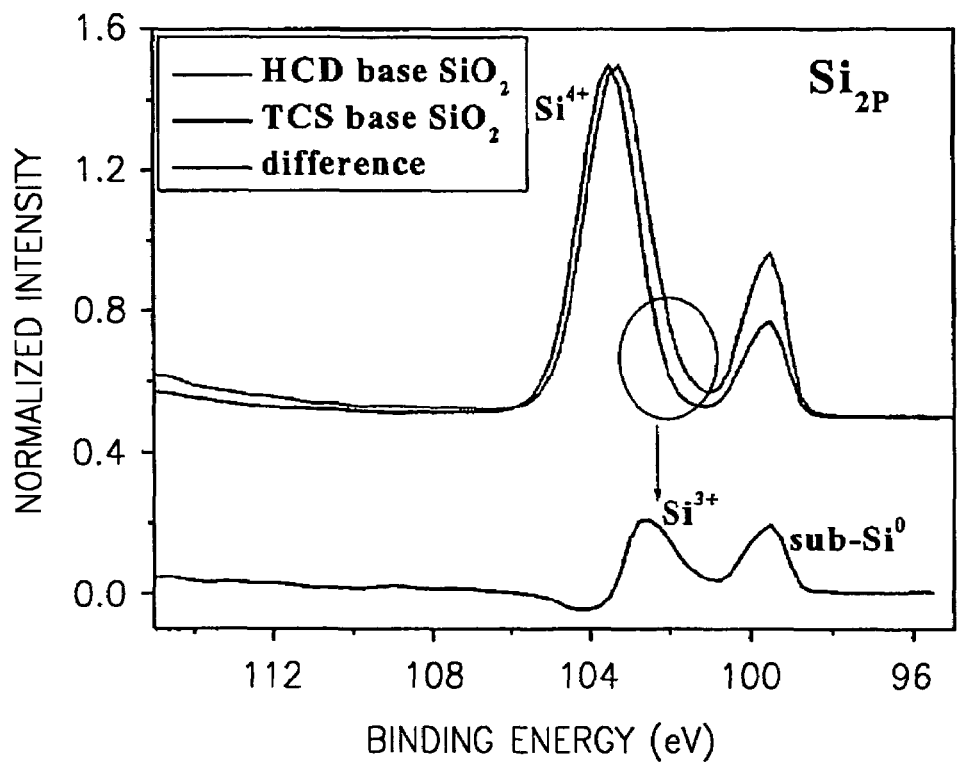
FIG. 5A compares the silicon bonding status of silicon in a $SiO_2$ monolayer formed using an ALD method according to this invention with that for a prior art ALD process.
Figure 5B:
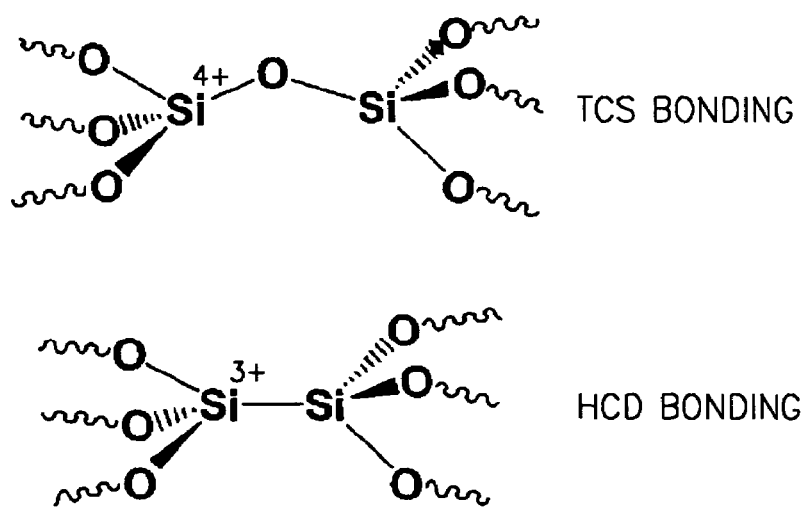
FIG. 5B schematically illustrates what is theorized to be the different silicon chemical bonding arrangements which account for the differences in bonding status established by FIG. 5A.

FIG. 5A uses XPS data to compare the silicon bonding status of silicon in a $SiO_2$ monolayer grown using the HCD approach of this invention with the bonding status of silicon in a monolayer grown using the prior art TCS method. The difference in bonding status seen in the graph of FIG. 5A, as well as the difference in silicon "richness" shown by FIG. 4, is believed to be explained by the different type of silicon bonds formed when the $SiO_2$ monolayer is grown by the HCD method instead of the TCS method. As schematically illustrated in FIG. 5B, the TCS method is believed to result in adjacent silicon atoms in a $SiO_2$ monolayer being bonded to each other only through an intermediate oxygen atom, whereas the HCD method of this invention is believed to result in at least some direct Si—Si bonding in the $SiO_2$ monolayer.

Figure 6:
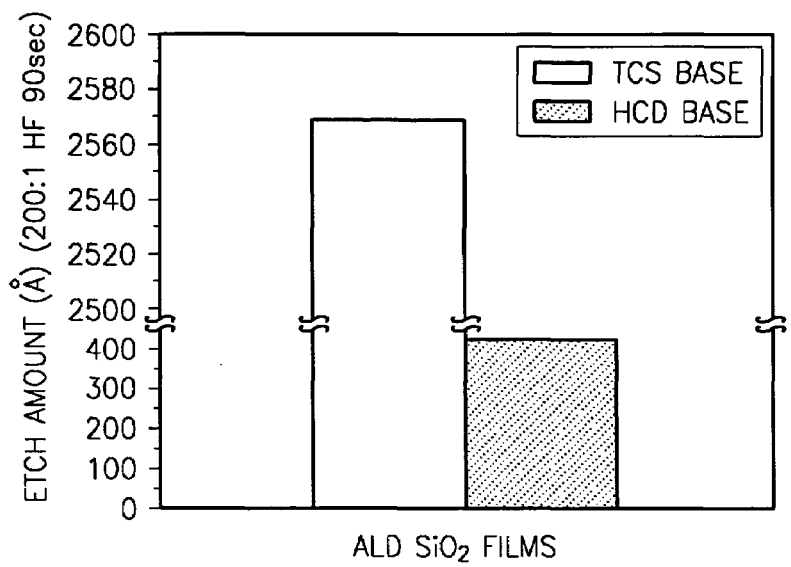
FIG. 6 compares the wet etch rate of a $SiO_2$ thin film formed using an ALD method according to this invention with that for a prior art ALD process.

FIG. 6 compares the wet etch rate of $SiO_2$ thin films formed using the HCD method of this invention with the wet etch rate for $SiO_2$ thin films formed using the prior art TCS method. (The vertical scale of the bar graph of FIG. 6 has been made discontinuous to accommodate the data.) FIG. 6 shows that the wet etch rate of $SiO_2$ thin films formed using the HCD method of this invention is about six times better than for $SiO_2$ thin films formed using the TCS method.

Second Exemplary Embodiment

According to a second exemplary embodiment of this present invention, silicon dioxide thin films are grown on a functionalized surface of a substrate using a silicon halide as the first reactant; a second reactant containing O and H atoms, e.g., H₂O and/or H₂O₂; and a tertiary aliphatic amine catalyst. In this embodiment of the invention, by exposing the functionalized surface of the substrate to a mixture of the first reactant and the catalyst in a first process step, a chemisorbed layer of the first reactant is formed along the substrate surface. Unreacted first reactant and byproducts are then removed from the region of the substrate. In the next process step, the chemisorbed layer of the first reactant is reacted with the second reactant in the presence of the tertiary aliphatic amine catalyst. Byproducts of this second reaction step are removed from the substrate region.

In accordance with this invention embodiment, it has been found that the use of a tertiary aliphatic amine as the reaction catalyst produces novel and entirely unexpected benefits in terms of process efficiency, the elimination or minimization of unwanted byproducts, and in the purity and quality of resultant SiO₂ thin films deposited on the substrate. More particularly, it has been found that if an amine which has even one nitrogen-hydrogen (N—H) bond, for example ammonia (NH₃) or a unitary or binary aliphatic amine (NR₃H₂ or NR₂H), is used as the catalyst, there will be a tendency to form unwanted byproducts having silicon-nitrogen (Si—N) bonds, as illustrated in equations (1) and (2) below:

$$SiCl_4 + NR_2H \rightarrow Cl_3Si\text{-}NR_2 + HCl \quad (1)$$

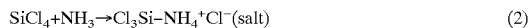

$$SiCl_4 + NH_3 \rightarrow Cl_3Si\text{-}NH_4^+Cl^- \text{(salt)} \quad (2)$$

wherein R is an aliphatic group ($C_xH_y$) having between about 1 and 5 carbon atoms, and further wherein the aliphatic groups R may be the same or different.

It has been found, however, that byproducts having Si—N bonds (for example, as illustrated on the right sides of equations (1) and (2) above) are main causes of particulate formation which leads to surface layer impurities and degrades the quality of the deposited SiO₂ thin films. By contrast, if a tertiary aliphatic amine catalyst having the general formula NR₃, where R is an aliphatic group ($C_xH_y$) having between about 1 and 5 carbon atoms, is used as the reaction catalyst, it has been found that substantially no particulate byproducts having Si—N bonds are formed. As a result, much purer SiO₂ thin films having higher quality and superior uniformity are deposited by the methods of this invention.

Figure 7:
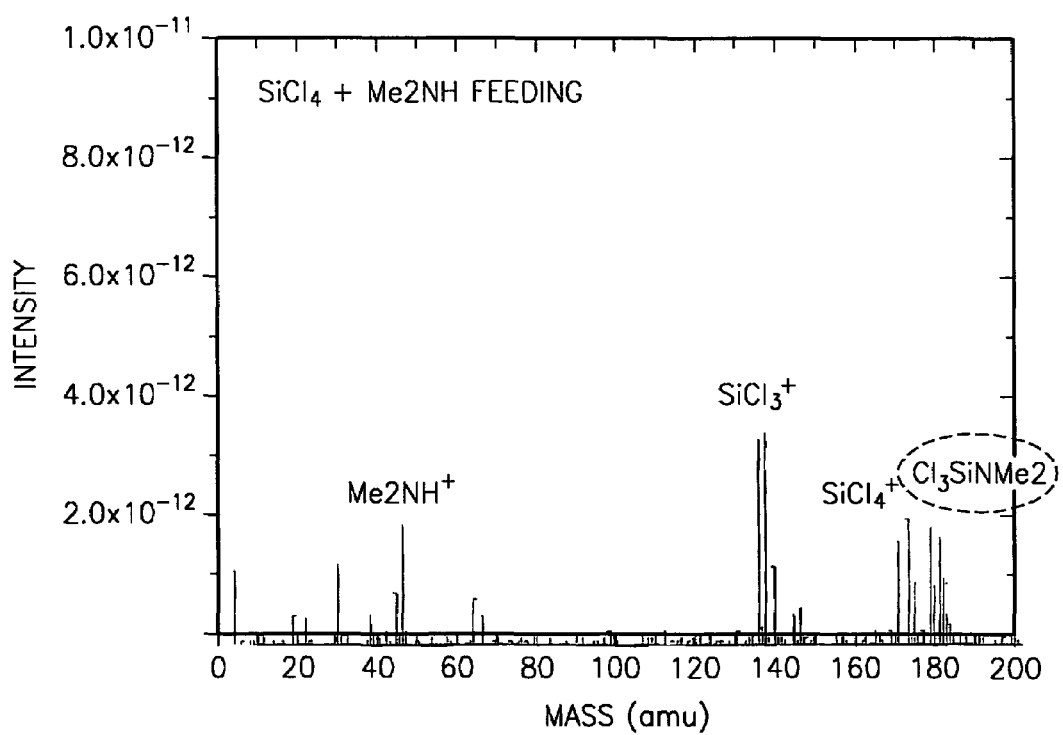
FIG. 7 is a chromatograph confirming the formation of unwanted particulate byproducts having Si—N bonds when an ALD process is carried out according to prior art teachings using a catalyst containing one or more N—H bonds.

FIG. 7 and Table 3 as discussed below demonstrate the validity and the enormous importance of this finding. FIG. 7 is a result of RGA analysis that confirms the formation of solid particulate byproducts when an ALD process is carried out using an amine catalyst that is not a tertiary aliphatic amine. FIG. 7 is based on a catalyzed ALD process as taught by Klaus '442 using SiCl₄ as the first reactant with dimethylamine ((H₃C)₂NH), an amine with a single N—H bond, as the catalyst. A residual mass spectrum apparatus was connected to the ALD reaction chamber to analyze byproducts coming from the reaction. The mass spectrum of FIG. 7 confirmed the formation of Cl₃Si—N(CH₃)₂ as an unwanted byproduct of the reaction. Such byproduct formation means that some of the Si from the SiCl₄ first reactant is being wasted in forming the byproduct instead of being deposited on the substrate surface as SiO₂.

Further evidence of the advantage of this invention embodiment relative to the prior art is shown in Table 3 below.

TABLE 3

| Catalyst | Triethylamine | Dimethylamine | NH3 |
|---|---|---|---|
| | Trimethylamine | | |

TABLE 3-continued

| Particle (size .16 μm) @Tencor | Several tens | Several thousands | Tens of thousands |
|---|---|---|---|

Table 3 compares the number of undesired particles (having a size of at least 0.16 μm) which were deposited on substrate surfaces of the same area when catalyzed ALD was carried out using SiCl₄ as a first reactant with different amines as the catalyst. Table 3 shows that using ammonia (NH₃) as the ALD catalyst, a molecule with three vulnerable N—H bonds, the ALD process resulted in tens of thousands of byproduct particles on the surface of the SiO₂ thin film. This very high level of particulate contamination on an SiO₂ thin film adversely affects performance of the semiconductor device and is completely unacceptable for many of the most demanding modem semiconductor applications.

Table 3 also shows that the use of dimethylamine as the ALD catalyst, a molecule with only one vulnerable N—H bond, is effective in somewhat reducing the production of particulate byproduct by about one order of magnitude. Even particulate production in the thousands range on an SiO₂ thin film, as obtained with dimethylamine catalyst, is still far in excess of acceptable limits for very high performance semiconductor devices. Table 3 further shows, however, that the use of trimethylamine as the ALD catalyst, thereby eliminating all vulnerable N—H bonds, has the dramatic and unexpected result of reducing the production of particles of byproduct to only several tens, a three order of magnitude reduction relative to ammonia, and a two order of magnitude reduction even relative to dimethylamine.

Another advantage of this embodiment of the invention relative to the prior art is that this invention embodiment uses a tertiary aliphatic amine catalyst instead of the pyridine which is the preferred catalyst for example in the Klaus '442 patent. Pyridine is a heterocyclic compound containing a ring of five carbon atoms and one nitrogen atom having the formula C₅H₅N. It exists at room temperature as a toxic liquid having a pungent, characteristic odor, which must be carefully handled. When used as a catalyst in an ALD process, pyridine must be vaporized to the gaseous state (the boiling point of pyridine is 115.5° C.). Thus, the equipment for treating pyridine is complicated, and a pyridine supply line is easily contaminated.

By contrast, a low molecular weight tertiary aliphatic amine, for example trimethylamine, is a gas at ambient conditions, which makes it easier to use than a catalyst prone to undergo a phase change at normal reaction conditions. Furthermore, the toxicity of trimethylamine is much lower than that of pyridine and the boiling point of trimethylamine is only 3~4° C.)

Third Exemplary Embodiment

According to a third particularly preferred embodiment of the present invention, many if not all of the advantages and benefits of both of the earlier-described embodiments of this invention can be realized. In this embodiment, silicon dioxide thin films are grown on a functionalized surface of a substrate using a silicon compound having at least two or more silicon atoms, e.g., a silicon halide such as Si₂Cl₆, as the first reactant; a compound containing O and H atoms, e.g., H₂O and/or H₂O₂, as the second reactant; and, a tertiary aliphatic amine catalyst.

Thus, in accordance with this invention embodiment, the functionalized surface of the substrate is exposed to a mixture of the first reactant and the tertiary aliphatic amine catalyst in a first process step to form a chemisorbed layer of the first reactant along the substrate surface. Unreacted first reactant and any byproducts are then removed from the region of the substrate. In the next process step, the chemisorbed layer of the first reactant is reacted with the second reactant in the presence of the tertiary aliphatic amine catalyst. Byproducts of this second reaction step are removed from the substrate region.

Figure 8:
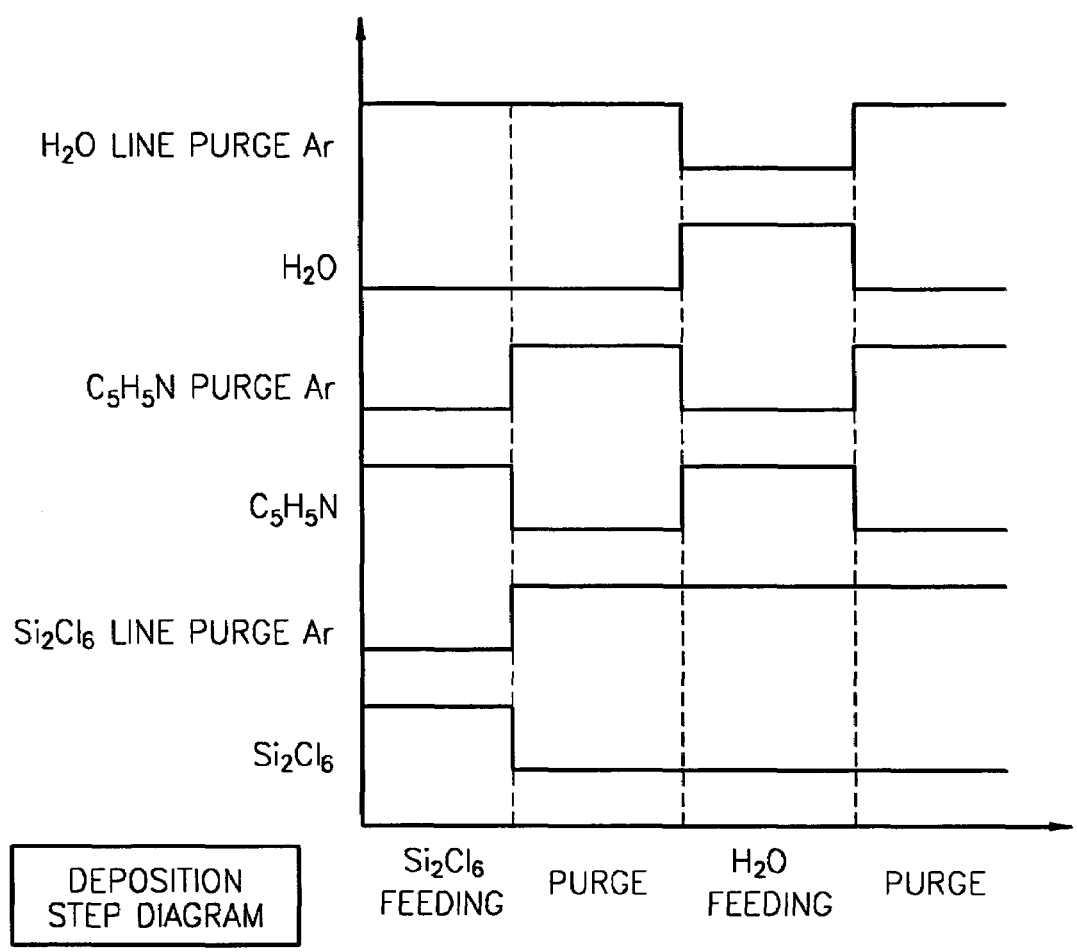
FIG. 8 illustrates a gas pulsing method of supplying reactant and catalyst feeds to the reactant chamber in accordance with one embodiment of this invention.

In still another embodiment of the present invention, it has been found that the use of a gas pulsing/purging method for one or more of the several process steps 132–138 of FIG. 1 can improve the efficiency of the methods of this invention, reduce process contamination, as well as improve the quality of resulting $SiO_2$ thin films grown on substrates. FIG. 8 illustrates a gas pulsing method for carrying out steps 132–138 of FIG. 1, as described below.

Step 132

A first reactant and a suitable catalyst are flowed into the reaction chamber through separate respective supply lines. At this time, inert gas, for example, argon gas, can be flowed into the chamber through a second reactant supply line to prevent the contamination from the mixture gas of first reactant and a catalyst.

Step 134

Inert gas for purging flows into the chamber through each of the first reactant supply line, the second reactant supply line, and the catalyst supply line.

Step 136

A second reactant which contains O and H, and a suitable catalyst are flowed into the chamber through separate respective supply lines. At this time, inert gas, for example, argon gas, can be flowed into the chamber through the first reactant supply line to purge the first reactant supply line.

Step 138

Inert gas for purging flows into the chamber through each of the first reactant supply line, the second reactant supply line, and the catalyst supply line.

Figure 9:
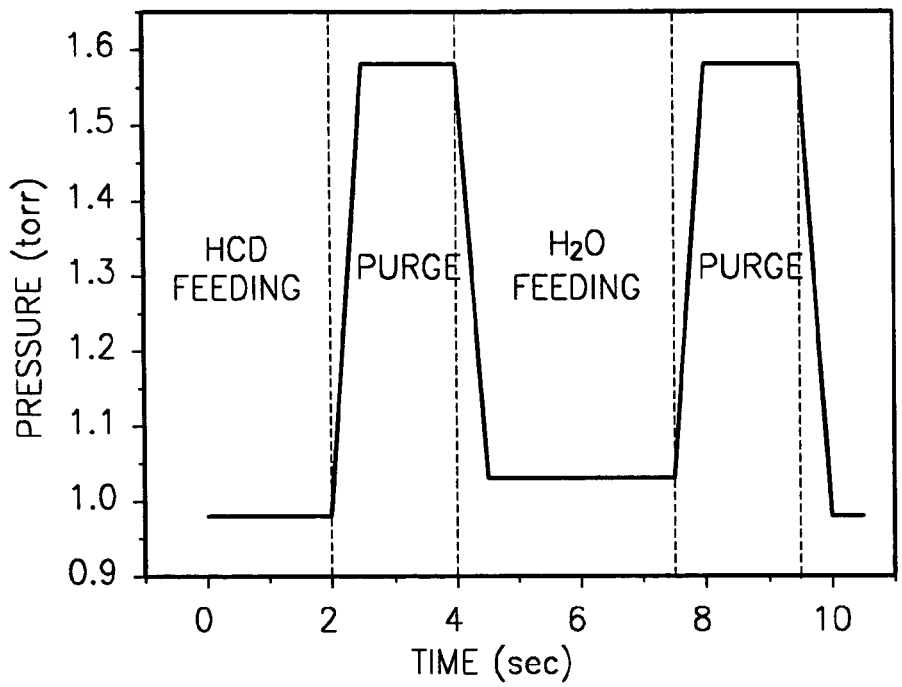
FIGS. 9–12 illustrate alternative possible representative "recipes" or sequencing cycles for gas pulsing/pumping and/or purging to be used in carrying out ALD methods in accordance with this invention.
Figure 10:
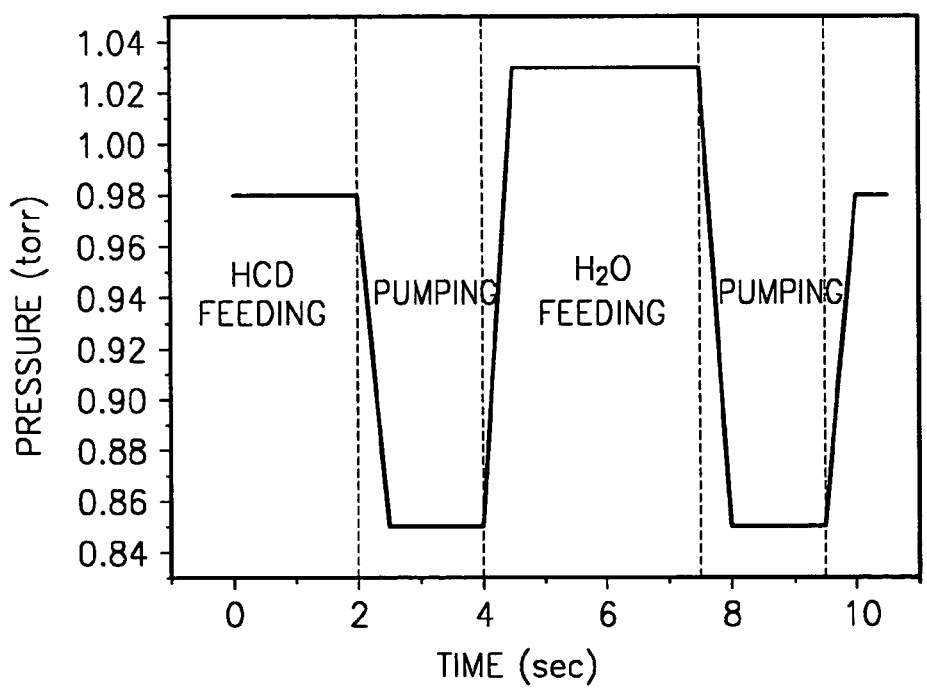
Figure 11:
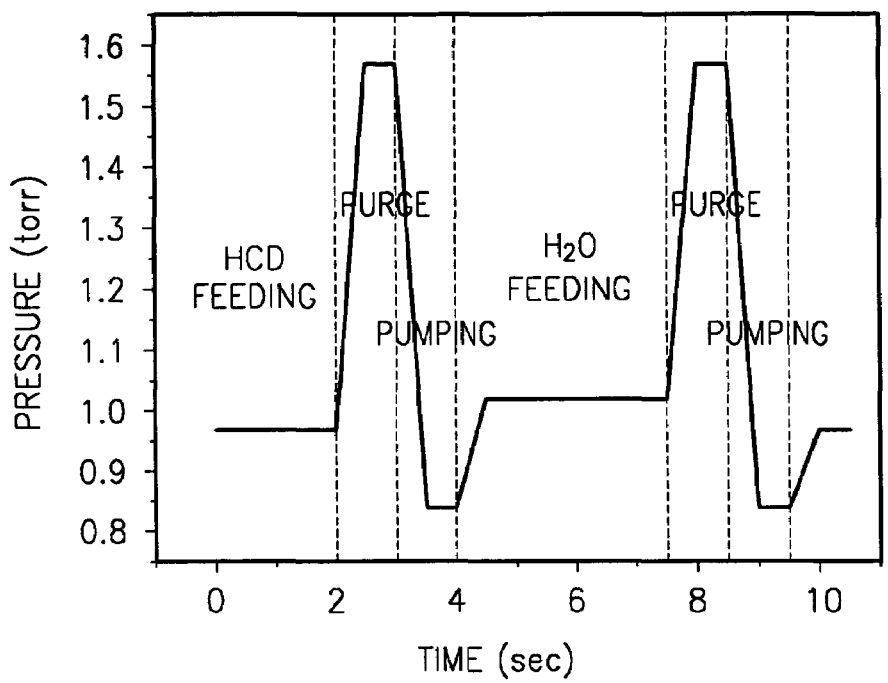
Figure 12:
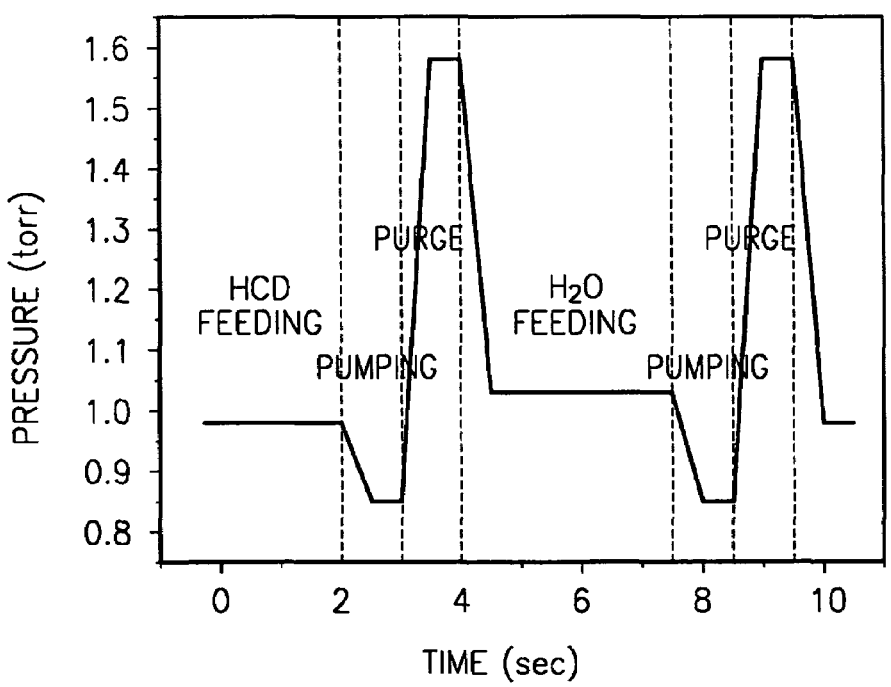

Some representative "recipes" or sequences for gas pulsing/pumping or purging the various feed lines and the reactant chamber in accordance with steps 132–138 of FIG. 1 over 10 second process time intervals are illustrated in FIGS. 9–12. FIG. 9 illustrates a process purge sequence comprising the following steps per cycle being conducted at and over selected process time periods using an inert gas to purge and remove byproducts: 0–2 seconds process time—HCD feeding; 2–4 seconds process time—purging; 4–7.5 seconds process time—$H_2O$ feeding; and 7.5–10 seconds—purging. FIG. 10 illustrates a process pumping sequence, wherein the pumping pressure is lower than the first and second reactant supply pressures, comprising the sequenced steps per cycle of: 0–2 seconds process time—HCD feeding; 2–4 seconds process time—pumping; 4–7.5 seconds process time—$H_2O$ feeding; and 7.5–10 seconds process time—pumping. FIG. 11 illustrates a process purge-pumping sequence, wherein pumping is used after purging, comprising the sequences steps per cycle of: 0–2 seconds process time—HCD feeding; 2–3 seconds process time—purging; 3–4 seconds process time—pumping; 4–7.5 seconds process time—$H_2O$ feeding; 7.5–8.5 seconds process time—purging; and 8.5–10 seconds process time—pumping. FIG. 12 illustrates a process pumping-purge sequence, wherein purging is used after pumping, comprising the sequenced steps per cycle of: 0–2 seconds process time—HCD feeding; 2–3 seconds process time—pumping; 3–4 seconds process time—purging; 4–7.5 seconds process to,e—pumping; 7.5–8.5 seconds process time pumping; and 8.5–10 seconds process time—purging.

Figure 13:
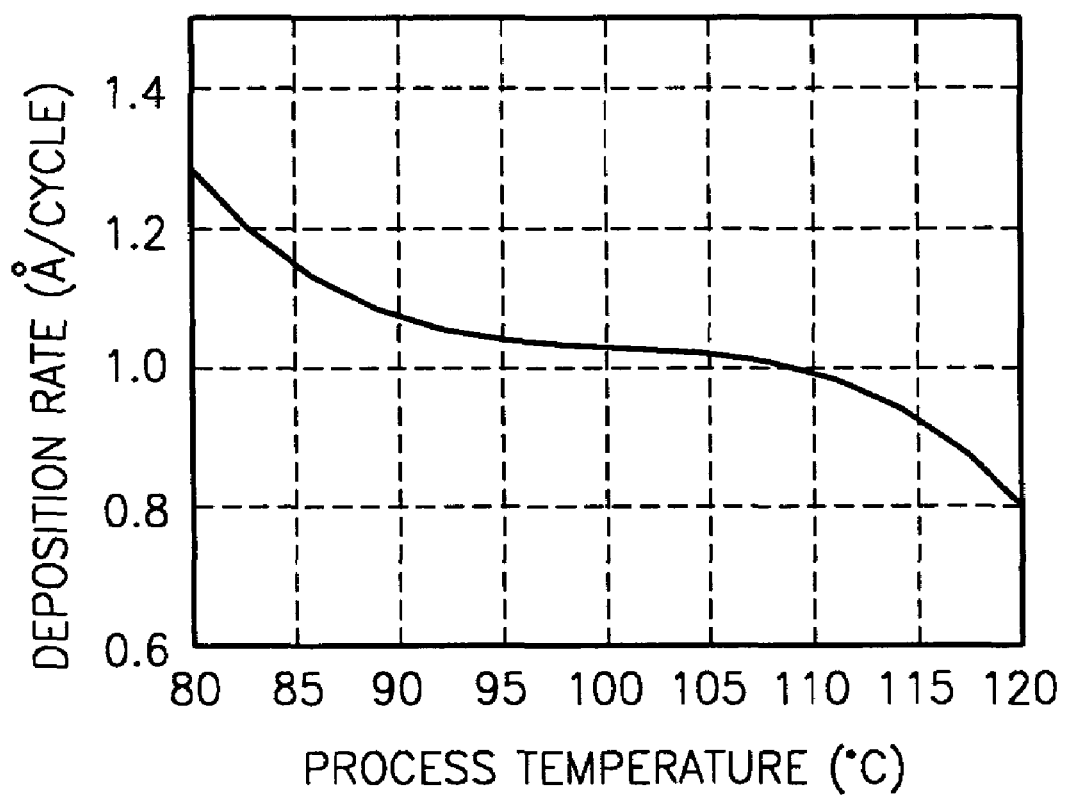
FIG. 13 illustrates how the $SiO_2$ deposition rate on a substrate using an ALD method in accordance with this invention varies in relation to process temperature.

In yet another embodiment of the present invention, temperature conditions for carrying out catalyst-assisted ALD for growing $SiO_2$ thin films on substrates according to this invention are optimized by balancing two competing process parameters. On the one hand, as illustrated in FIG. 13, the deposition rate for forming $SiO_2$ thin films using catalyst-assisted ALD and a multiple-silicon atom compound (e.g., $Si_2Cl_6$) as the first reactant is inversely proportional to temperature. FIG. 13 shows that, in general, the higher the process temperature, the slower the deposition rate. This appears to be due to desorption rate, and it is a distinctive feature of an ALD process because ALD is a surface reaction. The higher the process temperature, the higher the surface desorption activation energy of atoms participating in the reaction. As a result, the "staying time" at the surface becomes shorter than the necessary minimum time for the reaction to take place, in accordance with the following equation:

$$k_d = Ae^{-E_d/RT}$$

kd: Desorption Rate
A: Arrhenius Constant
Ed: Desorption Activation Energy
R: Gas Constant
T: Temperature The higher the process temperature, the more easily the O—H chain at the substrate surface is dehydroxylated. Thus, the number of reaction sites along the surface is reduced, and the deposition rate is reduced.

Figure 14:
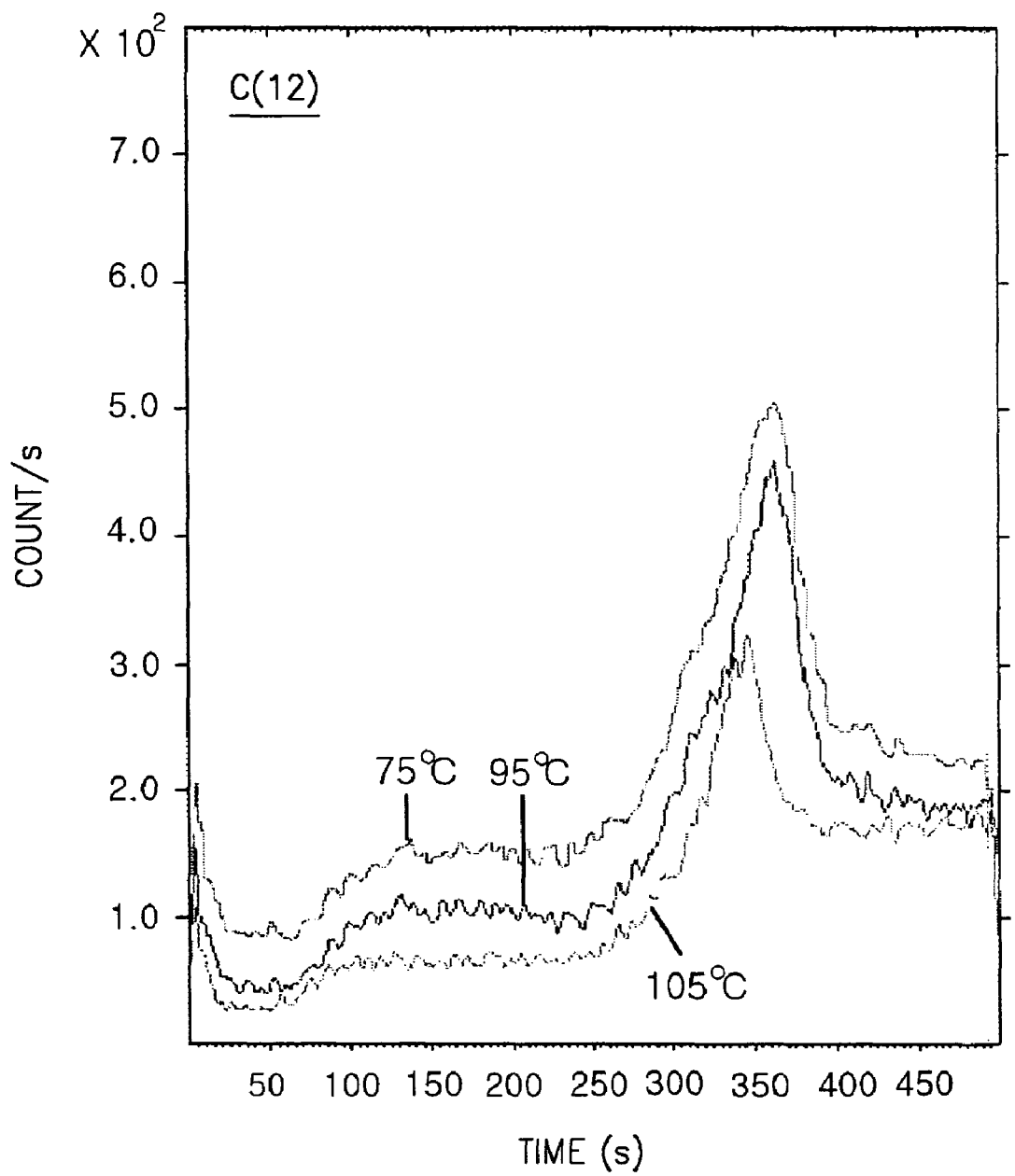
FIG. 14 illustrates how the impurity content (as measured by carbon present) of a $SiO_2$ thin film formed using an ALD method in accordance with this invention varies in relation to process temperature.

On the other hand, as illustrated in FIG. 14, a SIMS (secondary ion mass spectrometer) graph of carbon content over time at three different process temperatures, the carbon content of an ALD-deposited $SiO_2$ thin film also varies according to process temperature. In general, at lower process temperatures, carbon-containing byproducts of the ALD reaction processes are not fully removed from the substrate surface during processing and become trapped in the $SiO_2$ thin films being deposited. The resulting increase in the impurity level of the thin films results in a lower quality semiconductor device.

Accordingly, these two process parameters must be balanced against one another to optimize the process temperature conditions. Based on the foregoing considerations, it has been determined in accordance with this embodiment of the invention that the optimum process temperature range is about 90°–110° C.

Figure 15:
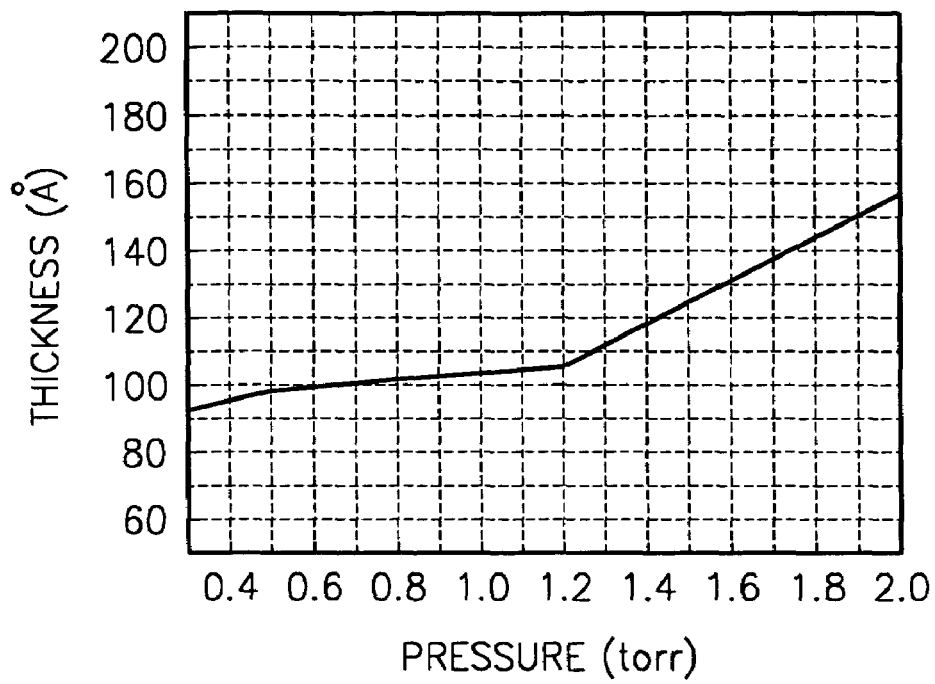
FIG. 15 illustrates how the $SiO_2$ deposition rate on a substrate using an ALD method in accordance with this invention varies in relation to process pressure.

In still another embodiment of the present invention, pressure conditions for carrying out catalyst-assisted ALD for growing $SiO_2$ thin films on substrates according to this invention are optimized by balancing two competing process parameters. On the one hand, as illustrated in FIG. 15, the deposition rate for forming $SiO_2$ thin films using catalyst-assisted ALD is directly proportional to process condition pressure, i.e., the higher the pressure, the thicker the layer of $SiO_2$ deposited over a given time period/number of ALD cycles.

Figure 16:
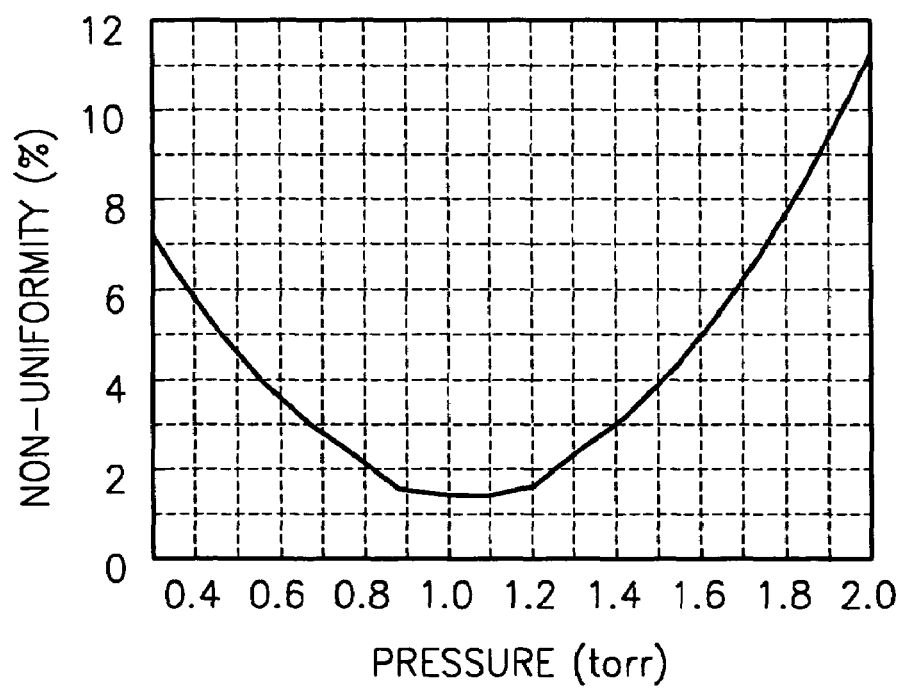
FIG. 16 illustrates how the non-uniformity of a $SiO_2$ thin film formed using an ALD method in accordance with this invention varies in relation to process pressure.

On the other hand, FIG. 16 illustrates that a non-linear relationship exists between process pressure and non-uniformity of the $SiO_2$ thin film. Thus, FIG. 16 shows that, up to a point, higher process pressure reduces non-uniformity of the layers deposited; but, beyond that point, higher pressure is correlated with higher non-uniformity.

Accordingly, these process parameters must be balanced against each other to optimize the process pressure conditions. Based on the foregoing considerations, it has been determined in accordance with this embodiment of the invention that the optimum process pressure range is about 500 mmtorr–5 torr.

It will be apparent to those skilled in the art that other changes and modifications may be made in the above-described improved catalyst-assisted ALD formation of $SiO_2$ thin layers on substrate surfaces for use in high performance semiconductor devices without departing from the scope of the invention described herein, and it is intended that all matter contained in the above description shall be interpreted in an illustrative and not a limiting sense.

What is claimed is:

1. In a method for forming a silicon dioxide layer on the surface of a substrate for semiconductor applications using a catalyst-assisted atomic layer deposition process, comprising at least the sequential steps of exposing a functionalized surface of the substrate to a first mixture consisting essentially of first reactant and first catalyst and thereafter exposing that surface to a second mixture consisting essentially of second reactant and second catalyst to form a silicon dioxide monolayer on the substrate surface, the improvement which comprises one or more of the following:
   (a) using a first reactant consisting essentially of at least one member selected from the group consisting of silicon compounds having at least two silicon atoms;
   (b) using a first catalyst consisting essentially of at least one member selected from the group consisting of tertiary aliphatic amine compounds; and,
   (c) using a first reactant consisting essentially of at least one member selected from the group consisting of silicon compounds having at least two silicon atoms in combination with using a first catalyst consisting essentially of at least one member selected from the group consisting of tertiary aliphatic amine compounds.

2. A method according to claim 1 wherein said first reactant consists essentially of a silicon-halide compound.

3. A method according to claim 1 wherein said first reactant consists essentially of $Si_2Cl_6$.

4. A method according to claim 1 wherein said first reactant is one selected from the group consisting of $Si_2X_6$, $Si_3X_8$, $Si_4X_{10}$, and $Si_3X_6$ (Triangle), wherein X is a halogen.

5. A method according to claim 1 wherein said first catalyst consists essentially of a tertiary aliphatic amine compound having the general formula $NR_3$, where each R represents the same or a different aliphatic group having from 1 to 5 carbon atoms.

6. A method according to claim 1 wherein said first catalyst consists essentially of trimethyl amine.

7. A method according to claim 1 wherein said first reactant consists essentially of $Si_2Cl_6$ and said first catalyst consists essentially of trimethyl amine.

8. A method according to claim 1 wherein said method is carried out at a temperature ranging from about 90°–110° C.

9. A method according to claim 1 wherein said method is carried out at a pressure ranging from about 500 mmtorr–5 torr.

10. A method according to claim 1, wherein the first catalyst and second catalyst are the same.

11. A method according to claim 1 wherein said method further comprises the steps of removing unreacted reactant, catalyst and reaction byproducts from the region of the substrate surface following each reaction step.

12. A method according to claim 2 wherein said method further comprises the steps of removing unreacted reactant, catalyst and reaction byproducts from the region of the substrate surface following each reaction step.

13. A method according to claim 11 wherein the first reactant, second reactant and catalyst are supplied to the substrate surface by separate feed lines.

14. A method according to claim 13 comprising the following deposition cycle: (a) a first reaction period during which first reactant and catalyst are fed through their respective feed lines to the substrate surface along with inert gas fed through the second reactant feed line; (b) a first purge period during which the feeds of first reactant and catalyst are stopped and, instead, inert gas is fed through the first and second reactant and catalyst feed lines; (c) a second reaction period during which second reactant and catalyst are fed through their respective feed lines to the substrate surface along with inert gas fed through the first reactant feed line; and, (d) a second purge period during which the feeds of second reactant and catalyst are stopped and, instead, inert gas is fed through the first and second reactant and catalyst feed lines.

15. A method according to claim 1, further comprising the steps of repeating the method multiple times on the same substrate to obtain a silicon dioxide thin film of a desired thickness.

16. A method according to claim 14 further comprising the steps of repeating the deposition cycle multiple times on the same substrate to obtain a silicon dioxide thin film of a desired thickness.

17. A method according to claim 1, further comprising a step of hardening the deposited silicon dioxide layer.

18. A method according to claim 17 wherein said hardening step is selected from one of the following:
   (a) a thermal treatment comprising annealing the silicon dioxide layer at about 300° C.–900° C. in the presence of an inert gas selected from the group consisting of $N_2$, $O_2$, $H_2$ and Ar;
   (b) a plasma treatment comprising annealing the silicon dioxide layer at about 200° C.–700° C. in the presence of $O_2$ or $H_2$; or,
   (c) an ozone treatment comprising exposing the silicon dioxide layer to $O_3$ at a temperature of about 25° C.–700° C.

19. A method according to claim 1 comprising for each atomic layer deposition a purge-pumping procedure according to the following sequence: feeding said first reactant and first catalyst to a region containing said substrate during a process time period $t_1$; purging the region with an inert gas during a time period $t_2$ immediately following period $t_1$; pumping the region to at least partially evacuate inert gas and other gaseous materials from the region during a time period $t_3$ immediately following period $t_2$; feeding said second reactant and second catalyst to the region during a time period $t_4$ immediately following period $t_3$; purging the region with an inert gas during a time period $t_5$ immediately following period $t_4$; and, pumping the region to at least partially evacuate inert gas and other gaseous materials from the region during a time period $t_6$ immediately following period $t_5$.

20. A method according to claim 1 comprising for each atomic layer deposition a pumping-purge procedure according to the following sequence: feeding said first reactant and first catalyst to a region containing said substrate during a process time period $t_1$; pumping the region to at least partially evacuate gaseous materials from the region during a time period $t_2$ immediately following period $t_1$; purging the region with an inert gas during a time period $t_3$ immediately following period $t_2$; feeding said second reactant and second catalyst to the region during a time period $t_4$ immediately following period $t_3$; pumping the region to at least partially evacuate gaseous materials from the region during a time period $t_5$ immediately following period $t_4$; and, purging the region with an inert gas during a time period $t_6$ immediately following period $t_5$.

21. A method for forming a silicon dioxide thin film on the surface of a substrate comprising the steps of:
    (a) loading the substrate into a chamber;
    (b) supplying a first reactant, a catalyst, and optionally an inert gas to the chamber, wherein said first reactant is a silicon-halide compound having at least two silicon atoms and said catalyst is selected from the group consisting of ammonia and amine;
    (c) purging reaction byproducts and unreacted first reactant and catalyst from the chamber;
    (d) supplying a second reactant, a catalyst, and optionally an inert gas to the chamber, wherein said second reactant is a compound having O components and said catalyst is selected from the group consisting of ammonia and amine;
    (e) purging reaction byproducts and unreacted second reactant and catalyst from the chamber; and,
    (f) repeating steps (a)–(e) until the silicon dioxide thin film reaches the desired thickness.

22. A method according to claim 21 wherein said first reactant is $Si_2Cl_6$.

23. A method according to claim 21 wherein said first reactant is one selected from the group consisting of $Si_2X_6$, $Si_3X_8$, $Si_4X_{10}$, and $Si_3X_6$ (Triangle), wherein X is a halogen.

24. A method according to claim 21 wherein said second reactant is selected from the group consisting of $H_2O$, ozone and $H_2O_2$.

25. A method according to claim 21 wherein the same catalyst is used in steps (b) and (d).

26. A method according to claim 21 wherein different catalysts are used in steps (b) and (d).

27. A method according to claim 21, wherein the catalyst is a tertiary aliphatic amine.

28. A method according to claim 21 wherein steps (b) through (e) are carried out according to the following sequence: feeding said first reactant and catalyst to said chamber during a process time period $t_1$; purging the chamber with an inert gas during a time period $t_2$ immediately following period $t_1$; pumping the chamber to at least partially evacuate inert gas and other gaseous materials from the chamber during a time period $t_3$ immediately following period $t_2$; feeding said second reactant and catalyst to the chamber during a time period $t_4$ immediately following period $t_3$; purging the chamber with an inert gas during a time period $t_5$ immediately following period $t_4$; and, pumping the chamber to at least partially evacuate inert gas and other gaseous materials from the chamber during a time period $t_6$ immediately following period $t_5$.

29. A method according to claim 21 wherein steps (b) through (e) are carried out according to the following sequence: feeding said first reactant and catalyst to said chamber during a process time period $t_1$; pumping the chamber to at least partially evacuate gaseous materials from the chamber during a time period $t_2$ immediately following period $t_1$; purging the chamber with an inert gas during a time period $t_3$ immediately following period $t_2$; feeding said second reactant and catalyst to the chamber during a time period $t_4$ immediately following period $t_3$; pumping the chamber to at least partially evacuate gaseous materials from the chamber during a time period $t_5$ immediately following period $t_4$; and, purging the chamber with an inert gas during a time period $t_6$ immediately following period $t_5$.

30. A method for forming a silicon dioxide thin film on the surface of a substrate comprising the steps of:
    (a) loading the substrate into a chamber;
    (b) supplying a first reactant, a catalyst, and optionally an inert gas to the chamber, wherein said first reactant is a silicon-halide compound and said catalyst is a tertiary aliphatic amine;
    (c) purging reaction byproducts and unreacted first reactant and catalyst from the chamber;
    (d) supplying a second reactant, a catalyst, and optionally an inert gas to the chamber, wherein said second reactant is a compound having O components and said catalyst is selected from the group consisting of ammonia and amine;
    (e) purging reaction byproducts and unreacted second reactant and catalyst from the chamber; and,
    (f) repeating steps (a)–(e) until the silicon dioxide thin film reaches the desired thickness.

31. A method according to claim 30 wherein said first reactant is $Si_2Cl_6$.

32. A method according to claim 30 wherein said first reactant is one selected from the group consisting of $Si_2X_6$, $Si_3X_8$, $Si_4X_{10}$, and $Si_3X_6$ (Triangle), wherein X is a halogen.

33. A method according to claim 30 wherein said second reactant is selected from the group consisting of $H_2O$, ozone and $H_2O_2$.

34. A method according to claim 30 wherein the same catalyst is used in steps (b) and (d).

35. A method according to claim 30 comprising carrying out steps (b) through (e) according to the following sequence: feeding said first reactant and catalyst to said chamber during a process time period $t_1$; purging the chamber with an inert gas during a time period $t_2$ immediately following period $t_1$; pumping the chamber to at least partially evacuate inert gas and other gaseous materials from the chamber during a time period $t_3$ immediately following period $t_2$; feeding said second reactant and catalyst to the chamber during a time period $t_4$ immediately following period $t_3$; purging the chamber with an inert gas during a time period $t_5$ immediately following period $t_4$; and, pumping the chamber to at least partially evacuate inert gas and other gaseous materials from the chamber during a time period $t_6$ immediately following period $t_5$.

36. A method according to claim 30 comprising carrying out steps (b) through (e) according to the following sequence: feeding said first reactant and catalyst to said chamber during a process time period $t_1$; pumping the chamber to at least partially evacuate gaseous materials from the chamber during a time period $t_2$ immediately following period $t_1$; purging the chamber with an inert gas during a time period $t_3$ immediately following period $t_2$; feeding said second reactant and catalyst to the chamber during a time period $t_4$ immediately following period $t_3$; pumping the chamber to at least partially evacuate other gaseous materials from the chamber during a time period $t_5$ immediately following period $t_4$; and, purging the chamber with an inert gas during a time period $t_6$ immediately following period $t_5$.

* * * * *